United States Patent [19]

Higuchi

[11] Patent Number: 4,570,325
[45] Date of Patent: Feb. 18, 1986

[54] MANUFACTURING A FIELD OXIDE REGION FOR A SEMICONDUCTOR DEVICE

[75] Inventor: Takayoshi Higuchi, Yokohama, Japan

[73] Assignee: Kabushiki Kaisha Toshiba, Japan

[21] Appl. No.: 680,909

[22] Filed: Dec. 12, 1984

[30] Foreign Application Priority Data

Dec. 16, 1983 [JP] Japan .................. 58-237357
May 10, 1984 [JP] Japan .................. 59-93184

[51] Int. Cl.⁴ .................. H01L 21/76; H01L 21/425
[52] U.S. Cl. .................. 29/576 W; 29/576 B; 29/571; 29/578; 29/580; 357/47
[58] Field of Search .............. 29/576 W, 576 B, 571, 29/578, 580; 148/D50, D78, D103, D98; 357/47

[56] References Cited

U.S. PATENT DOCUMENTS 3,886,000  5/1975  Bratter et al. .................. 29/580
4,460,413  7/1984  Hirata et al. .................. 29/576 W
4,465,532  8/1984  Fukano .................. 29/576 W Primary Examiner—Brian E. Hearn
Assistant Examiner—J. Callahan
Attorney, Agent, or Firm—Finnegan, Henderson, Farabow, Garrett & Dunner

[57] ABSTRACT

A method of manufacturing a semiconductor device in which a micro-patterned field oxide film can be formed includes the steps of: sequentially forming an oxidation-resistive film and an oxidizable film on a semiconductor substrate; forming a window in a predetermined region of said oxidizable film, in which said oxidation-resistive film is exposed; performing thermal oxidation to said oxidizable film so as to convert it into an insulating film and for narrowing a width of said window by volume expansion due to conversion; forming a field oxide film in a region of said semiconductor substrate defined by said window of said insulating film; and forming a semiconductor element in the region of said semiconductor substrate isolated by said field oxide film.

11 Claims, 22 Drawing Figures

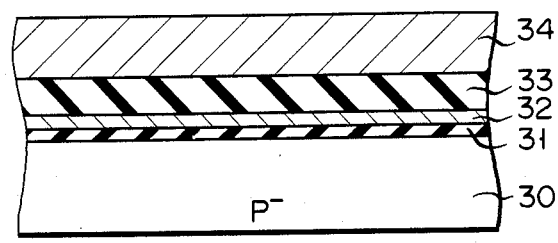
F I G. 3A
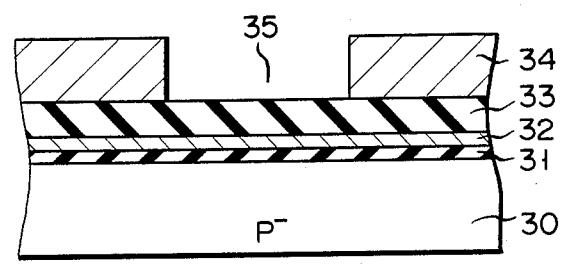
F I G. 3B
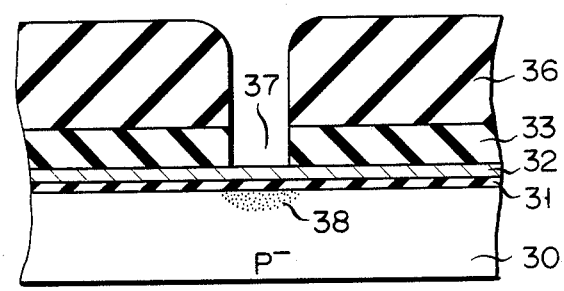
F I G. 3C
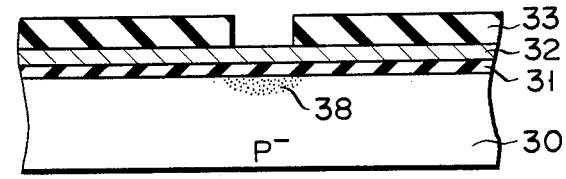
F I G. 3D
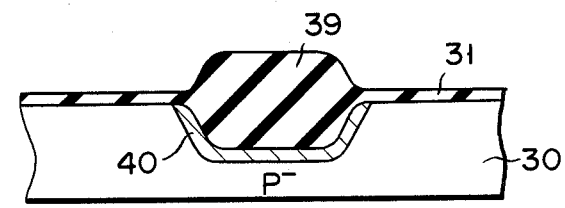
F I G. 3E

MANUFACTURING A FIELD OXIDE REGION FOR A SEMICONDUCTOR DEVICE

BACKGROUND OF THE INVENTION

The present invention relates to a method of manufacturing a semiconductor device and, more particularly, to a method of forming a micro-patterned field region in a semiconductor device.

Conventional semiconductor devices, for example, are manufactured as follows. As shown in FIG. 1A, a thermal oxide film 2 having a thickness of about 900 Å is formed on a p$^-$-type silicon substrate 1 having a plane (100). A polycrystalline silicon film 3 with a thickness of about 500 Å and a silicon nitride film 4 with a thickness of about 2,500 Å are sequentially formed on the thermal oxide film 2.

As shown in FIG. 1B, a resist film is then formed on the silicon nitride film 4 and is patterned by photolithography, thereby forming a resist pattern 5 having an opening corresponding to a prospective field region of the silicon substrate 1. The silicon nitride film 4 is selectively removed by reactive ion etching using the resist pattern 5 as a mask. An impurity 8 for preventing inversion is ion-implanted in the silicon substrate 1 through the polycrystalline silicon film 3 and the thermal oxide film 2 from the thus formed opening 6. In this case, boron can be used as the impurity and the irradiating condition can be an accelerating energy of 100 KeV and a dose of $1 \times 10^{13}$ cm$^{-2}$.

After removing the resist pattern 5, the resultant structure is subjected to thermal oxidation in an oxidizing atmosphere using the residual silicon nitride film 4 as an oxidation-resistive mask so as to form a field oxide film 9 with a thickness of about 8,000 Å, as shown in FIG. 1C. By this heat treatment, the impurity 8 for preventing inversion is diffused to form a field inversion layer 10 immediately under the field oxide film 9.

Thereafter, the residual silicon nitride film 4 and the polycrystalline silicon film 3 are removed. An element region isolated by the field oxide film 9 is subjected to impurity diffusion or the like, thereby forming a semiconductor element. In this manner, a semiconductor device which satisfies predetermined requirements can be obtained.

According to a method of manufacturing a semiconductor device, more particularly, to a forming method of a field region as described above, the field oxide film 9 undesirably extends along the lateral direction thereof by about 0.7 μm. In addition, the resist film has a resolution limit of about 1.2 μm. Therefore, a micro-patterned field oxide film having a width of 1.9 μm or less cannot be obtained.

An element isolation technique of the buried isolation type shown in FIGS. 2A to 2F is currently receiving a lot of attention as an alternative to the above-mentioned selective oxidation technique.

A first thermal oxide film 12 having a thickness of 1,000 Å is formed on a p$^-$-type silicon substrate 11 having a plane (100). A photoresist pattern 13 is formed on an element forming region. Thereafter, an impurity for preventing field inversion, e.g., B$^+$, is ion-implanted under the conditions of an acceleration energy of 120 KeV and a dose of $3 \times 10^{13}$ cm$^{-2}$ using the photoresist pattern 13 as a mask so as to form a boron-doped layer 14 (FIG. 2A). The first thermal oxide film 12 is selectively etched using the photoresist pattern 13 as a mask. Subsequently, after removing the photoresist pattern 13, boron in the boron-doped layer 14 is diffused by a heat treatment, thereby forming a p-type impurity region 15 as a field inversion preventive layer (FIG. 2B). The substrate 11 is etched to a depth of about 6,000 Å using the residual first thermal oxide film 12 as a mask so as to form a groove 16, and to form a p-type field inversion preventive layer 17 in a portion which constitutes the groove 16. Then, the residual first thermal oxide film 12 is removed (FIG. 2C).

A second thermal oxide film 18 with a thickness of about 500 Å is formed on a surface of the substrate 11 including an inner surface of the groove 6. Thereafter, a CVD oxide film 19 is deposited on the overall surface of the resultant structure to a thickness of 6,000 Å (FIG. 2D). Subsequently, after coating a photoresist on the overall surface of the oxide film 19, the photoresist is etched by reactive ion etching so as to leave a photoresist pattern 20 in a recessed portion of the CVD oxide film 19 corresponding to a shape of the groove 16 (FIG. 2E). The remaining photoresist pattern 20, the CVD oxide film 19 and the second thermal oxide film 18 are simultaneously etched by reactive ion etching so as to expose the substrate 11. Then, the CVD oxide film 19 is buried in the groove of the substrate 11, thus forming an element isolation region (FIG. 2F).

Thereafter, for example, a MOS semiconductor element is formed in an element region surrounded by the CVD oxide film 19 in a conventional manner, thereby obtaining a MOS semiconductor device.

However, the element isolation technique of the buried isolation type as described above has the following disadvantages.

In the process of FIG. 2A, boron is ion-implanted using the photoresist pattern 13 as a mask so as to form the boron-doped layer 14, and in the process of FIG. 2B, the boron of the boron-doped layer 14 is diffused by annealing, thereby forming the p-type impurity region 15. Thereafter, in the process of FIG. 2C, the substrate 11 is etched to form the groove 16, and the p-type field inversion preventive layer 17 is formed in the portion which constitutes the groove 16. However, according to this technique, since the boron cannot be sufficiently diffused near a major surface of the substrate 11, a field inversion preventive layer having a higher concentration than that of the substrate 11 is not formed. As a result, when, for example, n$^+$-type source and drain regions of the MOS transistor are formed in the element region after forming the element isolation region by burying the CVD oxide film 19 in the groove of the substrate 11 in the process up to FIG. 2F, a junction-leakage current easily flows at the field edges 21, resulting in the degradation in electrical characteristics of the device.

For this reason, in order to prevent the field inversion preventive layer from being formed near the major surface of the substrate 11, shallow ion-implantation is performed in the process corresponding to that of FIG. 2A, and the substrate 11 is then etched to form the groove 16 in the process corresponding to that of FIG. 2C. Thereafter, boron is ion-implanted again, thereby forming the field inversion preventive region near the major surface of the substrate 11. However, in this method, additional ion-implantation and heat treatment processes must be performed, thereby making the process complex.

SUMMARY OF THE INVENTION

It is an object of the present invention to provide a method of manufacturing a semiconductor device in which a considerably micro-patterned field oxide film can be easily formed.

A method of manufacturing a semiconductor device according to the present invention comprises the steps of:

(a) sequentially forming an oxidation-resistive film and an oxidizable film on a semiconductor substrate;

(b) forming a window in a predetermined region of said oxidizable film, in which said oxidation-resistive film is exposed;

(c) performing thermal oxidation to said oxidizable film so as to convert said oxidizable film into an insulating film and for narrowing a width of said window by volume expansion due to conversion;

(d) forming a field oxide film in a region of said semiconductor substrate defined by said window of said insulating film; and (e) forming a semiconductor element in the region of said semiconductor substrate isolated by said field oxide film.

In step (a), if the oxidation-resistive film is directly formed on the surface of the substrate, a so-called "white ribbon" may occur in the surface of the substrate in the thermal oxidation of step (c), thereby degrading element properties. Therefore, a thermal oxide film is preferably formed on the surface of the substrate.

Step (d), that is, the step of forming the field oxide film in a region of the semiconductor substrate defined by the window of the insulating film, can be performed by a method in which selective oxidation is used or a method in which an oxide film is buried in a groove.

The method in which thermal oxidation is used comprises the steps of selectively removing the oxidation-resistive film using the insulating film as a mask, and performing thermal oxidation using the selectively removed oxidation-resistive film as a mask. In this case, another oxidizable film can be formed between the semiconductor substrate and the oxidation-resistive film. When another oxidizable film is formed, this oxidizable film is also thermally oxidized. Before performing thermal oxidation for forming the field oxide film, an impurity of the same conductivity type as that of the substrate can be selectively doped in the substrate using the insulating film and the selectively removed oxidation-resistive film as a mask. In this case, the impurity is diffused and activated to form an inversion preventive layer under the field oxide film formed in thermal oxidation.

Meanwhile, the method of burying an oxide film in the groove comprises the steps of selectively removing the oxidation-resistive film and the semiconductor substrate using the insulating film as a mask so as to form a groove in the substrate, and filling the groove with an oxide film. In order to fill the groove, the oxide film is deposited on the overall surface of the structure, including that of the groove, by a CVD method. At this time, the groove in the oxide film which is formed to correspond to the groove in the substrate is filled with a resist film, and the overall surface of the structure is etched until the surface of the substrate is exposed. If the CVD film is in direct contact with the substrate, there is the risk of degrading the element properties. Therefore, a thermal oxide film is preferably formed on the overall surface of the substrate including the groove. On the other hand, before performing thermal oxidation, an impurity of the same conductivity type as that of the substrate can be selectively doped in the substrate using the oxidizable film as a mask. In this case, the impurity is diffused and activated in the thermal oxidation process, thereby forming an inversion preventive layer under the field oxide film. Since the impurity is introduced before the thermal oxidation, that is, before the width of the window of the oxidizable film is decreased, an impurity region can be widened. For this reason, the inversion preventive layer can be reliably formed in a peripheral portion of the field oxide film, more particularly, a portion on the surface of the substrate.

In the method of the present invention, a silicon nitride film can be used as the oxidation-resistive film, and a metal silicide such as a polycrystalline silicon, molybdenum silicide or the like can be used as the oxidizable film.

According to the method of the present invention, a considerably micro-patterned field oxide film can be easily formed. Particularly, when the method of forming the oxide film in the groove of the substrate is used for forming the field oxide film, the field inversion preventive layer can be reliably formed. Therefore, current leakage in a p-n junction can be effectively prevented.

BRIEF DESCRIPTION OF THE DRAWINGS

FIGS. 3A to 3E are sectional views for explaining steps for forming a field oxide film according to an embodiment of the present invention.

DETAILED DESCRIPTION OF THE PREFERRED EMBODIMENTS

Figure 1A:
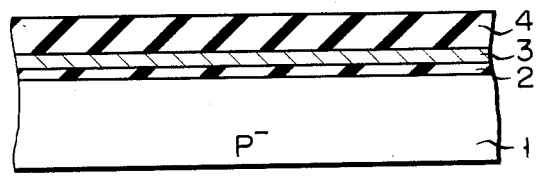
FIGS. 1A to 1C are sectional views for explaining steps for forming a conventional field oxide film.
Figure 1B:
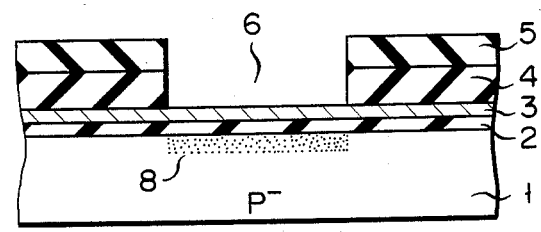
Figure 1C:
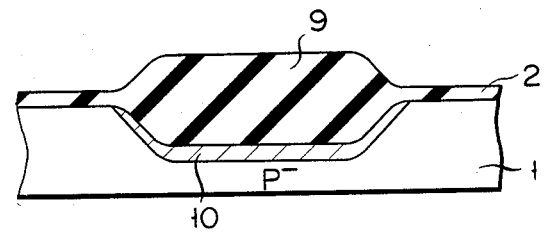
Figure 2A:
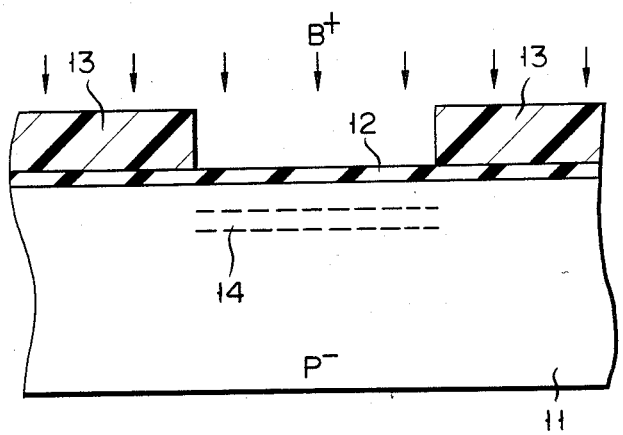
FIGS. 2A to 2F are sectional views for explaining steps for forming another conventional field oxide film.
Figure 2B:
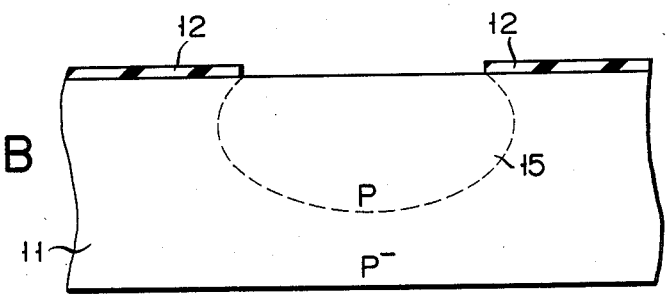
Figure 2C:
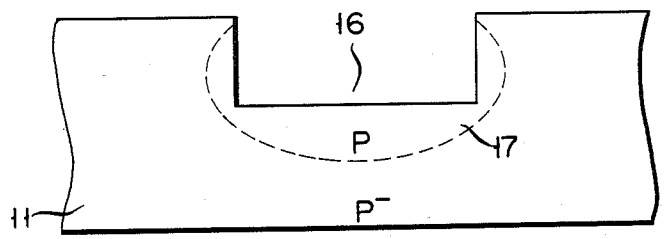
Figure 2D:
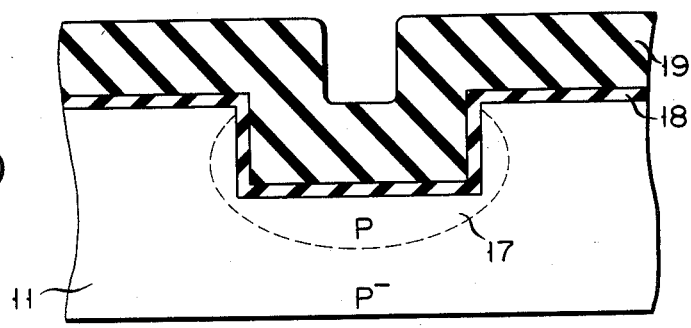
Figure 2E:
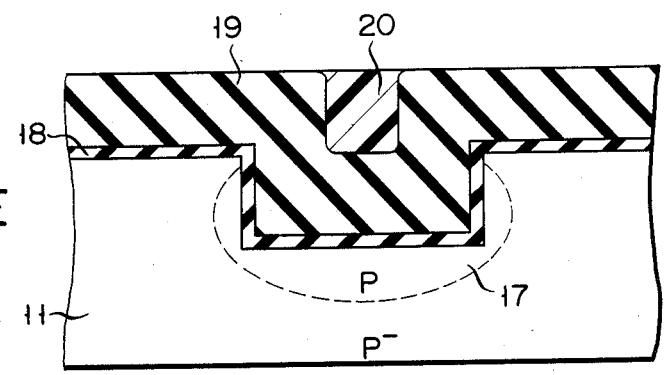
Figure 2F:
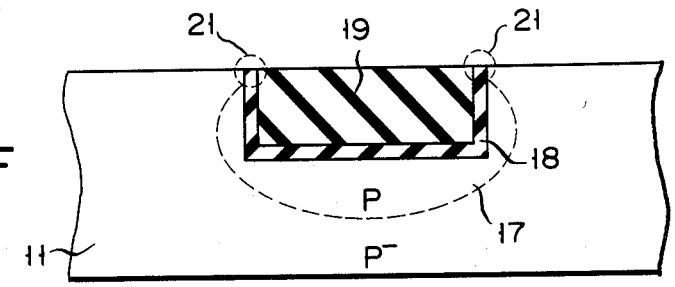

The present invention will be described by way of example with reference to the accompanying drawings. Note that in Example 1, a field region is formed using a selective oxidation method, and in Example 2, a field region is formed by burying an insulating layer in a groove provided in a substrate.

EXAMPLE 1

As shown in FIG. 3A, a first insulating film 31 which is formed of a thermal oxide film having a thickness of about 900 Å is formed on a p$^-$-type silicon substrate 30 having a plane (100). A first oxidizable film 32 formed of a polycrystalline silicon film with a thickness of about 500 Å and an oxidation-resistive film 33 formed of a silicon nitride film with a thickness of 2,500 Å are sequentially formed on the first insulating film 31. Furthermore, a second oxidizable film 34 formed of a polycrystalline silicon film with a thickness of 3,500 Å is formed on the oxidation-resistive film 33. In this case, the first oxidizable film 32 and the oxidation-resistive film 33 can be formed by a low-temperature CVD method.

As shown in FIG. 3B, a resist film (not shown) having a window at a region corresponding to a prospective field region is placed in the second oxidizable film 34. A window 35 is formed in the second oxidizable film 34 by reactive ion etching using the resist film as a mask.

As shown in FIG. 3C, after removing the resist film, the resultant structure is subjected to thermal oxidation in a combusting, oxidizing atmosphere, thereby converting the second oxidizable film 34 into a second insulating film 36 of about 7,000 Å in thickness. When the second oxidizable film 34 is converted into the second insulating film 36, volume expansion occurs. The extent of the volume expansion is set such that a window 37, which will be formed in an oxidation-resistive film 33 in a later step, is reduced and cancels the lateral extension of a field oxide film 39, which will also be formed in the later process.

The window 37 is formed in the oxidation-resistive film 33 using the second insulating film 36 as a mask. An impurity 38 for preventing inversion is ion-implanted in the silicon substrate 30 through the window 37, the first oxidizable film 32 and the first insulating film 31. B$^+$ is used as the impurity 38, and ion-implantation conditions are set to be an acceleration energy of 100 KeV and a dose of about $1 \times 10^{13}$ cm$^{-2}$.

As shown in FIG. 3D, the second insulating film 36 is removed.

As shown in FIG. 3E, the silicon substrate 30 is subjected to thermal oxidation in a combusting, oxidizing atmosphere using the residual oxidation-resistive film 33 as a mask so as to form the field oxide film 39 having a thickness of about 8,000 Å. In this case, the impurity 38 is diffused and activated by this annealing, thereby forming a field inversion preventive layer 40 immediately under the field oxide film 39. Then, the oxidation-resistive film 33 and the first oxidizable film 32 are removed. Thereafter, an element region isolated by the field oxide film 39 is subjected to an impurity diffusion process and the like, thus forming a semiconductor element which satisfies predetermined requirements.

In this manner, according to a method of manufacturing a semiconductor device, when the second oxidizable film 34 is converted into the second insulating film 36, volume expansion occurs. In this case, a volume expansion coefficient of the film can be set so that the lateral extension of the field oxide film 39 can be cancelled by a decrease in the diameter of the window 35. As a result, the field oxide film 39 can be formed by utilizing the window 37 of the oxidation-resistive film 33 formed in accordance with the window 35, thereby achieving micro-patterning.

EXAMPLE 2

Figure 4A:
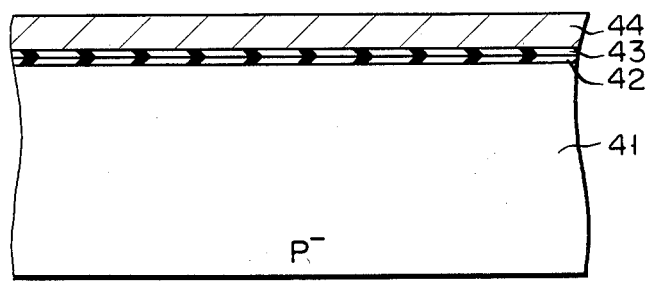
FIGS. 4A to 4H are sectional views for explaining steps for forming a field oxide film according to another embodiment of the present invention.
Figure 4B:
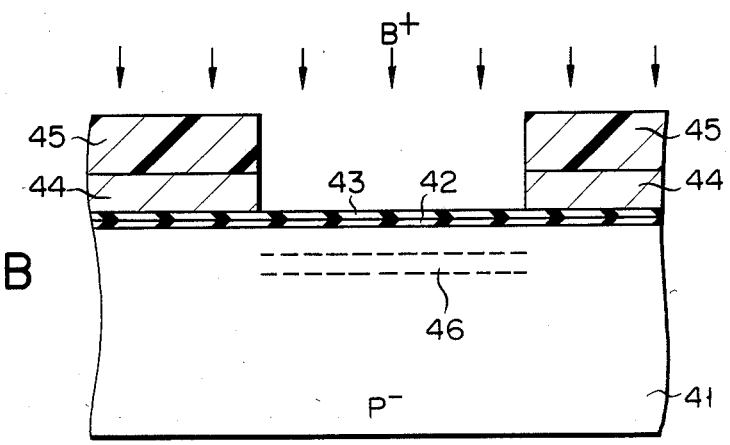
Figure 4C:
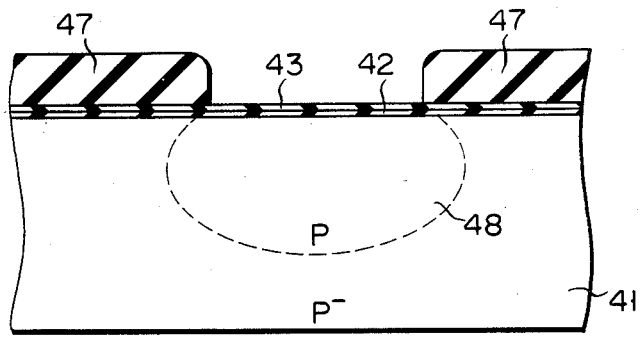

A first thermal oxide film 42 is formed on a surface of a p$^-$-type silicon substrate 41 having a plane (100) so as to have a thickness of about 500 Å. A silicon nitride film (oxidation-resistive film) 43 having a thickness of about 500 Å and a polycrystalline silicon film (oxidizable film) 44 having a thickness of about 2,000 Å are sequentially deposited on the first thermal oxide film 42 (FIG. 4A). A photoresist pattern 45 which has an opening wider than a final element isolation width is formed on an element region forming portion. Thereafter, the polycrystalline silicon film 44 is etched by reactive ion etching using the pattern 45 as a mask. Subsequently, an impurity for preventing field inversion, e.g., B$^+$, is ion-implanted under the conditions of an acceleration energy of 100 KeV and a dose of $3 \times 10^{13}$ cm$^{-2}$ using the photoresist pattern 45 as a mask, thereby forming a boron-doped layer 46 (FIG. 4B). After removing the photoresist pattern 45, the resultant structure is subjected to thermal oxidation in a combusting oxidizing atmosphere, so that the polycrystalline silicon film 44 is converted into a second thermal oxide film 47, thus expanding the volume thereof. Simultaneously, the doped boron in the boron-doped layer 46 is diffused, thereby forming a p-type impurity region 48 as a field inversion preventive layer (FIG. 4C).

Figure 4D:
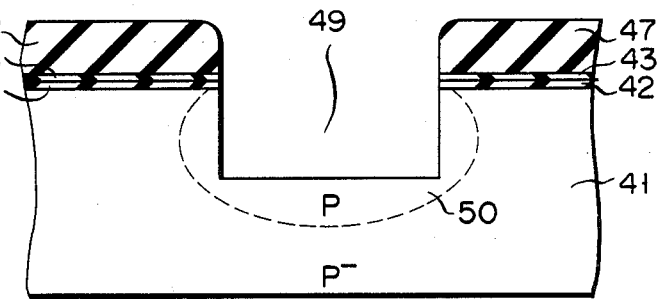
Figure 4E:
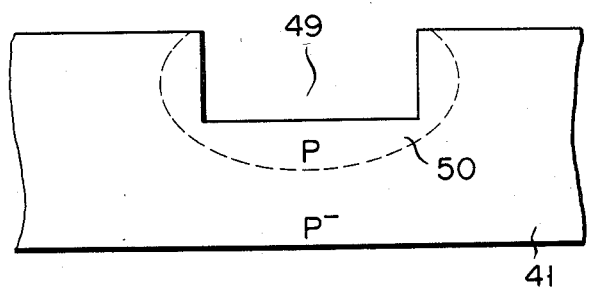

The silicon nitride film 43 and the first thermal oxide film 42 are sequentially etched using the second thermal oxide film 47 as a mask, and furthermore, the substrate 41 is etched to a depth of about 6,000 Å, thereby forming a groove 49. Then, a p-type field inversion preventive layer 50 is formed in a portion which defines the groove 49 (FIG. 4D). The second thermal oxide film 47, the silicon nitride film 43 and the first thermal oxide film 42 are sequentially removed by etching (FIG. 4E).

Figure 4F:
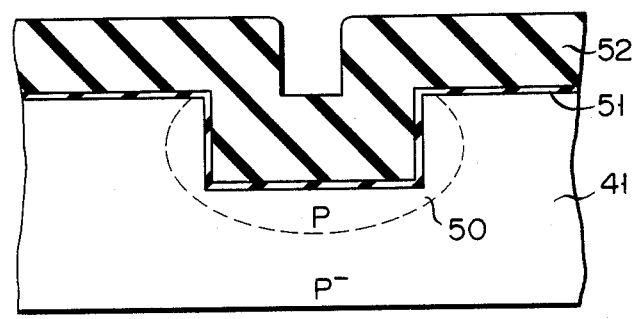
Figure 4G:
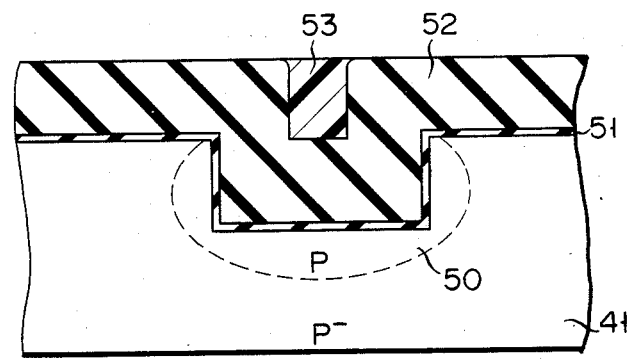
Figure 4H:
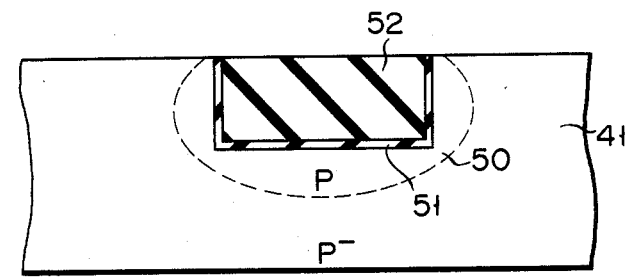

A third thermal oxide film 51 is formed on a surface of the substrate 41 including the groove 49 so as to have a thickness of about 500 Å. Sequentially, a CVD oxide film 52 having a thickness of about 6,000 Å is deposited on the overall surface of the resultant structure (FIG. 4F). After coating a photoresist on the overall surface, the photoresist pattern is etched by reactive ion etching so that a photoresist 53 remains in a recessed portion of the CVD oxide film 52 corresponding to a shape of the groove 49 (FIG. 4G). The residual photoresist 53, the CVD oxide film 52 and the third thermal oxide film 51 are simultaneously etched to expose the surface of the substrate 41 by reactive ion etching. Thus, the CVD oxide film 52 is buried in the groove 49 through the third thermal oxide film 51, thereby forming an element isolation region (FIG. 4H).

Thereafter, for example, a MOS semiconductor element is formed in an element region surrounded by the CVD oxide film 52 in accordance with a conventional process.

Therefore, according to the method as described above, in the process shown in FIG. 4B, boron for preventing field inversion is ion-implanted using the oxidizable film (polycrystalline silicon film 44) as a mask which has an opening wider than the final element isolation width. Thereafter, in the process shown in FIG. 4C, the polycrystalline silicon film 44 is thermally oxidized, thereby forming the second thermal oxide film 47. As a result, the volume of the polycrystalline silicon film 44 is expanded so that the opening thereof becomes the same as the final element isolation width, and the doped boron is then diffused, thereby forming the p-type impurity region as the field inversion preventive layer. Therefore, when the groove 49 is formed by etching the substrate 41 using the second thermal oxide film 47 as a mask in the process shown in FIG. 4D, the field inversion preventive layer 50 can also be formed in a major surface of the substrate 41 to finally be a field edge. As a result of this, in the processes shown in FIGS. 4E to 4H, the CVD oxide film 52 is formed in the groove 49 through the thermal oxide film 51, thereby forming the element isolation region. Thereafter, even if, for example, n$^+$-type source and drain regions of a MOS transistor are formed in the element region surrounded by the CVD oxide film 52, a p-n junction with the p-type field inversion preventive layer 50 is provided, thereby reducing a junction leakage current.

In the above embodiment, the first thermal oxide film 42 is formed on the substrate 41 before forming the silicon nitride film 43 as the oxidation-resistive film. However, the first thermal oxide film 42 can be omitted. However, in this case, if the thermal oxide film is not formed under the silicon nitride film 43, white ribbon may be formed in the surface of the substrate 41 in thermal oxidation of the polycrystalline silicon film 44, resulting in a degradation of the element properties. Therefore, the thermal oxide film is preferably formed under the silicon nitride film 43.

In the above embodiment, in the process shown in FIG. 4F, the third thermal oxide film 51 is formed on the surface of the substrate 41 including the groove 49 before forming the CVD oxide film 52. However, the third thermal oxide film can be omitted. However, in this case, when the third oxide film is not formed, there is a risk of degrading the element properties since the CVD oxide film 52 having a degraded film quality is brought into direct contact with the substrate 41. Therefore, the third thermal oxide film is preferably formed.

What is claimed is:

1. A method of manufacturing a semiconductor device, comprising the steps of:
   (a) sequentially forming an oxidation-resistive film and an oxidizable film on a semiconductor substrate;
   (b) forming a window in a predetermined region of said oxidizable film, in which said oxidation-resistive film is exposed;
   (c) performing thermal oxidation to said oxidizable film so as to convert said oxidizable film into an insulating film and for narrowing a width of said window by volume expansion due to conversion;
   (d) forming a field oxide film in a region of said semiconductor substrate defined by said window of said insulating film; and
   (e) forming a semiconductor element in the region of said semiconductor substrate isolated by said field oxide film.

2. A method according to claim 1, wherein in said step (a), a thermal oxide film is formed on said semiconductor substrate before forming said oxidation-resistive film.

3. A method according to claim 1, wherein said step (d) of forming said field oxide film comprises the steps of selectively removing said oxidation-resistive film using said insulating film as a mask, removing said insulating film, and performing thermal oxidation using said oxidation-resistive film which is selectively removed as a mask.

4. A method according to claim 2, further comprising the step of forming another oxidizable film between said semiconductor substrate and said oxidation-resistive film, a part of said another oxidizable film being converted into an oxide film by the thermal oxidation.

5. A method according to claim 3, further comprising the step of introducing an impurity of the same conductivity type as that of said semiconductor substrate into said semiconductor substrate using said oxidation-resistive film as a mask, after selectively removing said oxidation-resistive film.

6. A method according to claim 1, wherein said step (d) of forming said field oxide film comprises the steps of forming a groove in said semiconductor substrate by selectively removing said oxidation-resistive film and said semiconductor substrate using said insulating film as a mask, removing said insulating film and said oxidation-resistive film, and burying the groove with an oxide film.

7. A method according to claim 6, wherein said step of burying the groove with the oxide film is performed in such a manner that an oxide film is deposited on an overall surface of said semiconductor substrate including the groove, another groove in the oxide film which is formed corresponding to the groove of said substrate is buried with a resist film and an overall surface is subjected to etching.

8. A method according to claim 6, wherein another thermal oxide film is formed on an overall surface of said semiconductor substrate including the groove before burying the groove with the oxide film.

9. A method according to claim 6, further comprising the step of introducing an impurity of the same conductivity type as that of said semiconductor substrate into said semiconductor substrate using said oxidizable film as a mask after said step (b).

10. A method according to claim 1, wherein said oxidation-resistive film is formed of silicon nitride.

11. A method according to claim 1, wherein said oxidizable film is formed of a material selected from the group consisting of polycrystalline silicon and a metal silicide.

* * * * *